US010295132B2

(12) United States Patent
Lomenzo et al.

(10) Patent No.: US 10,295,132 B2
(45) Date of Patent: May 21, 2019

(54) FIELD-CURVABLE CARRIAGE FOR FLEXIBLE LIGHT COVE

(71) Applicant: Light Engine Technologies, Inc., Smithtown, NY (US)

(72) Inventors: Joseph Lomenzo, Smithtown, NY (US); Travis Sawyer, Astoria, NY (US)

(73) Assignee: Light Engine Technologies, Inc., Smithtown, NY (US)

( * ) Notice: Subject to any disclaimer, the term of this patent is extended or adjusted under 35 U.S.C. 154(b) by 48 days.

(21) Appl. No.: 15/827,767

(22) Filed: Nov. 30, 2017

(65) Prior Publication Data

US 2018/0156400 A1    Jun. 7, 2018

Related U.S. Application Data

(60) Provisional application No. 62/429,265, filed on Dec. 2, 2016.

(51) Int. Cl.
| | | |
|---|---|---|
| F21S 8/00 | (2006.01) | |
| F21S 4/20 | (2016.01) | |
| F21V 14/02 | (2006.01) | |
| F21V 15/01 | (2006.01) | |
| F21V 21/02 | (2006.01) | |
| F21V 19/00 | (2006.01) | |
| F21V 7/00 | (2006.01) | |
| F21S 8/04 | (2006.01) | |
| F21S 4/22 | (2016.01) | |
| H05K 1/18 | (2006.01) | |
| F21Y 103/00 | (2016.01) | |
| F21Y 107/70 | (2016.01) | |

(52) U.S. Cl.
CPC ............ *F21S 8/033* (2013.01); *F21S 4/20* (2016.01); *F21S 4/22* (2016.01); *F21S 8/03* (2013.01); *F21S 8/04* (2013.01); *F21V 7/0008* (2013.01); *F21V 14/02* (2013.01); *F21V 15/013* (2013.01); *F21V 19/0095* (2013.01); *F21V 21/02* (2013.01); *F21Y 2103/00* (2013.01); *F21Y 2107/70* (2016.08); *H05K 1/189* (2013.01)

(58) Field of Classification Search
USPC ........................................................... 362/432
See application file for complete search history.

(56) References Cited

U.S. PATENT DOCUMENTS

| | | | |
|---|---|---|---|
| 4,725,931 A | | 2/1988 | Bourdon |
| 7,029,143 B2 | | 4/2006 | Kiechle et al. |
| 7,249,870 B1 | * | 7/2007 | Shwisha ............... F21S 8/033 362/147 |
| 7,658,518 B2 | | 2/2010 | Shwisha |
| 9,062,840 B2 | | 6/2015 | Swisha et al. |
| 2005/0225982 A1 | * | 10/2005 | Hahn .................. F21V 7/0016 362/249.16 |

* cited by examiner

*Primary Examiner* — Sean P Gramling
(74) *Attorney, Agent, or Firm* — Stradley Ronon Stevens & Young, LLP

(57) ABSTRACT

A field-curvable carriage that can contour with complex shapes and curves intended to integrate LED lighting modules for cove lighting. The engineered prefabricated linear carriage which serves as a substructure for the attachment of classic building finishes has an assortment of mechanically predesignated flex points, a flexible fascia, a flexible connection bracket, and captive pins including fixed and adjustable mounting provisions for integration of a variety of electrical and mechanical components.

20 Claims, 5 Drawing Sheets

FIELD-CURVABLE CARRIAGE FOR FLEXIBLE LIGHT COVE

RELATED APPLICATION

This application claims the benefit of priority to U.S. Provisional Patent Application Ser. No. 62/429,265, filed on Dec. 2, 2016, the contents of which are incorporated in this application by reference.

TECHNICAL FIELD

The invention relates to architectural lighting. More particularly, the invention relates to light fixtures for indirect lighting that can contour with complex shapes and curves in architectural spaces.

BACKGROUND OF THE INVENTION

Well-developed fields exist in indirect lighting and architectural lighting fixtures. A particular area of indirect lighting is known as cove lighting. In a typical cove lighting situation, an upwardly open channel structure is built along a wall near the ceiling. The wall may be a side wall of a room, a side wall of a recess in a ceiling, a side surface of a beam or the like. Light bulbs are mounted within the channels so that the emitted light escapes generally upward to directly light the wall and ceiling above, and indirectly an interior of a room and its contents. The channels are built with conventional building techniques involving framing, sheetrock, plaster and the like.

Frequently, this lighting effect is desired in walls that are curved. To build a curved lighting cove with traditional building materials requires additional labor and has imperfections that generate discrepancies in the lighting effect. There are no pre-fabricated systems in place that can handle changes in shape of the cove to follow the wall or ceiling pattern.

Alternatives involve elongated fixtures used for cove lighting. Such fixtures typically include an elongated bulb within an elongated reflector positioned so that light from the bulb and reflector is directed to indirect surfaces like a wall or ceiling, rather than directly onto objects within a room. These fixtures may be assembled end-to-end within the pre-existing channel. Elongated lighting bulbs are often provided in the form of fluorescent tube lamps, LED light fixtures and incandescent light bulbs. Exemplary systems are shown in U.S. Pat. No. 4,725,931; U.S. Pat. No. 7,029,143; U.S. Pat. No. 7,658,518; and U.S. Pat. No. 9,062,840.

BRIEF SUMMARY OF THE INVENTION

In one embodiment, the invention is a field-curvable carriage that is able to contour with complex shapes and curves intended to integrate LED lighting modules for cove lighting, but is also able to function as a carriage for other electronics or wire elements that need to be concealed within the architecture of a space. The carriage has details for affixing traditional building materials such as wood, metal, drywall, rubber, plastic and plaster to the carriage allowing it to be integrated into the context of the surrounding building material finishes. Once installed, the carriage defines an engineered pocket that allows provisions for lighting modules such as LED light fixtures to be installed. In another embodiment, the invention can also be used without light fixtures to create a discreet pocket.

One aspect of the invention involves a light apparatus mounted to the surface of a building. The apparatus has at least one flexible elongated mounting carriage, at least one flexible fascia mounted to the carriage, at least one flexible connection bracket connecting the fascia to the mounting carriage with captive pins, at least one mounting cleat to secure the carriage to building structure and at least one mounting receptacle for installation of a light source or similar electronic device.

Another aspect of the invention involves a flexible polymer based resin material fascia that has provisions to promote adhesion of drywall compounds. This fascia can be parallel with the wall or angled to create different visual effects.

Another aspect of the invention involves a connection bracket that connects the polymer fascia to the main carriage. This connection bracket translates smooth curved geometry defined by fascia to the angular geometry of the main carriage body through captive pins.

Another aspect of the invention involves the captive pins that connect the flexible apparatus to the main carriage body. Each pin relates to a corresponding slot on the main carriage body that allows free range of motion over a defined path.

Another aspect of the invention involves the main carriage body. The flexible main carriage body has a continuous metallic channel that is subdivided into articulating segments of similar composition. The main carriage body is able to articulate into the angular geometry of the traditional building materials of the architecture.

Another aspect of the invention involves the mounting receptacle for light fixtures, electrical devices, sensors, power units, transmitters, signage, cables or similar equipment. This mounting receptacle will define and maintain the position of light fixtures in the optimal alignment for indirect lighting of a cove.

Another aspect of the invention involves the mounting cleat which has multiple embodiments that will allow the attachment of the main carriage body to the building structure. The mounting cleats define a wireway between the main carriage body and the building structure to allow for discreet electrical pathways to provide power to light fixtures or similar electrical equipment. Through this mounting cleat the building structure influences the articulation of the main carriage body to generate a path on any axis.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The terminology used herein is for the purpose of describing particular embodiments only and is not intended to be limiting of the invention. As used herein the term "and/or" includes any and all combinations of one or more of the associated listed items. As used herein the singular forms "a," "an," "and," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the contents of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

The present disclosure is to be considered as an exemplification of the invention, and is not intended to limit the invention to the specific embodiments illustrated by the figures or descriptions below.

Figure 1:
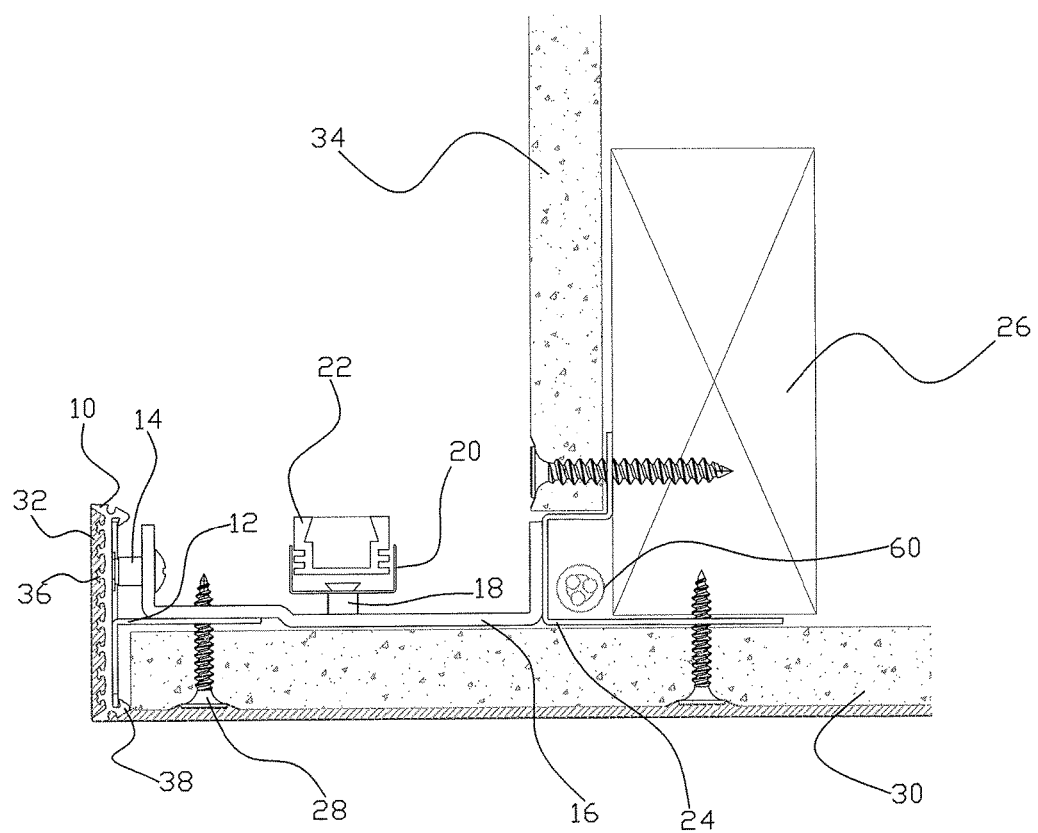
FIG. 1 is a sectional view through one embodiment of the invention.
Figure 2:
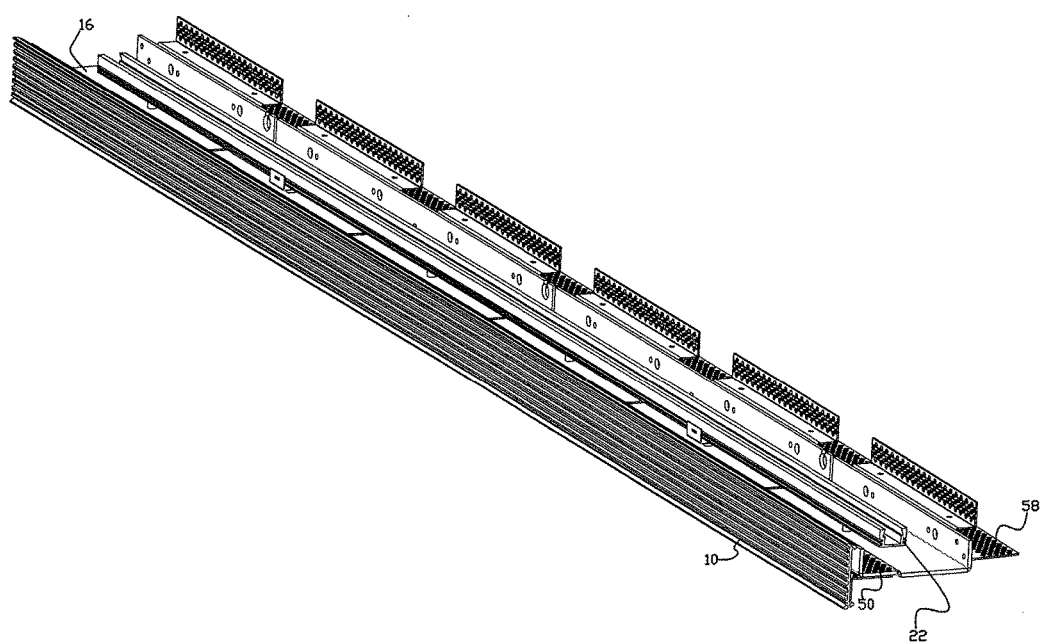
FIG. 2 is an isometric view of an embodiment of the invention from the viewpoint of the fascia.
Figure 3:
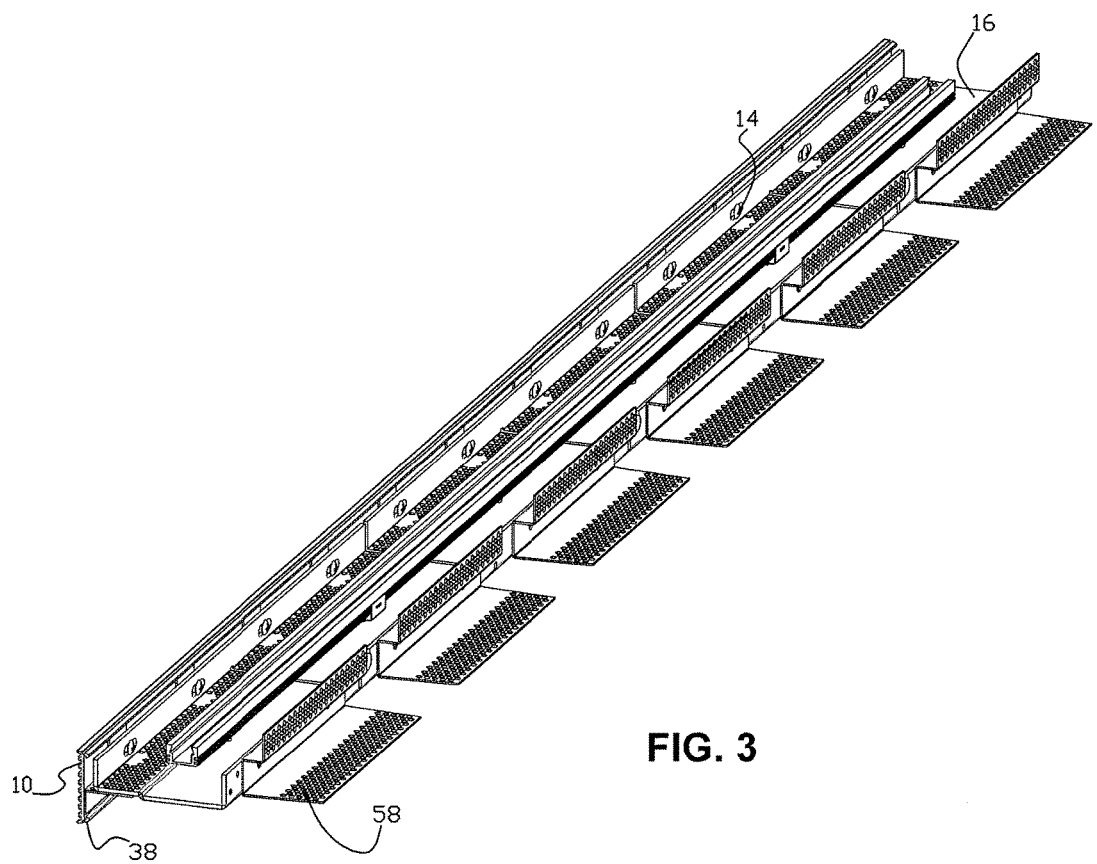
FIG. 3 is an isometric view of an embodiment of the invention from the viewpoint of the mounting cleat.

Referring now to the drawing, in which like reference numbers refer to like elements throughout the various figures that comprise the drawing, FIG. 1 shows a light fixture assembly with the main carriage body 16 mounted to a building structure 26 through a mounting cleat 24. The building structure 26 may include or be a wall 34 of a room, a wall of a ceiling cove, a side of a structural beam, or the like, or combinations. The light fixture assembly may be positioned adjacent to and slightly below a ceiling or ceiling portion. The light fixture assembly may extend in depth and height to accommodate various LED modules, electrical assemblies or similar systems. The light fixture assembly may include one, two, or more individual fixture units or subsystem units assembled or otherwise arranged end-to-end. In the exemplary cove mounting situation, a ceiling portion 30 is disposed along the cove and extends laterally beyond the cove.

In one embodiment, the exemplary light fixture assembly is a field-curvable carriage that is able to contour with complex shapes and curves intended to integrate LED lighting modules for cove lighting, but is also able to function as a carriage for other electronics or wire elements that need to be concealed within the architecture of a space. The carriage provides the appearance of an integral part of the building. The carriage has details for affixing traditional building materials such as wood, metal, drywall, rubber, plastic and plaster to the carriage, allowing it to be integrated into the context of the surrounding building material finishes. Once installed, the carriage defines an engineered pocket that allows provisions for lighting modules such as LED light fixtures to be installed. In another embodiment, the invention can also be used without light fixtures to create a discreet pocket.

The exemplary light fixture assembly contains at least one flexible polymer based resin material fascia 10 that has provisions 36, such as a pattern formed in the fascia 10, to promote adhesion of drywall compounds 32. This elongated polymer component fascia 10 integrates into a flexible connection bracket 12 and remains flexible during installation. This flexible fascia 10 is connected to the flexible connection bracket 12 through the use of a captive guide 38 that allows for lateral movement of the fascia 10. Flexible fascia 10 can also be comprised of wood or wood product to create a wood-like veneer and can be provided in a variety of shapes depending on desired visual appearance.

Figure 4:
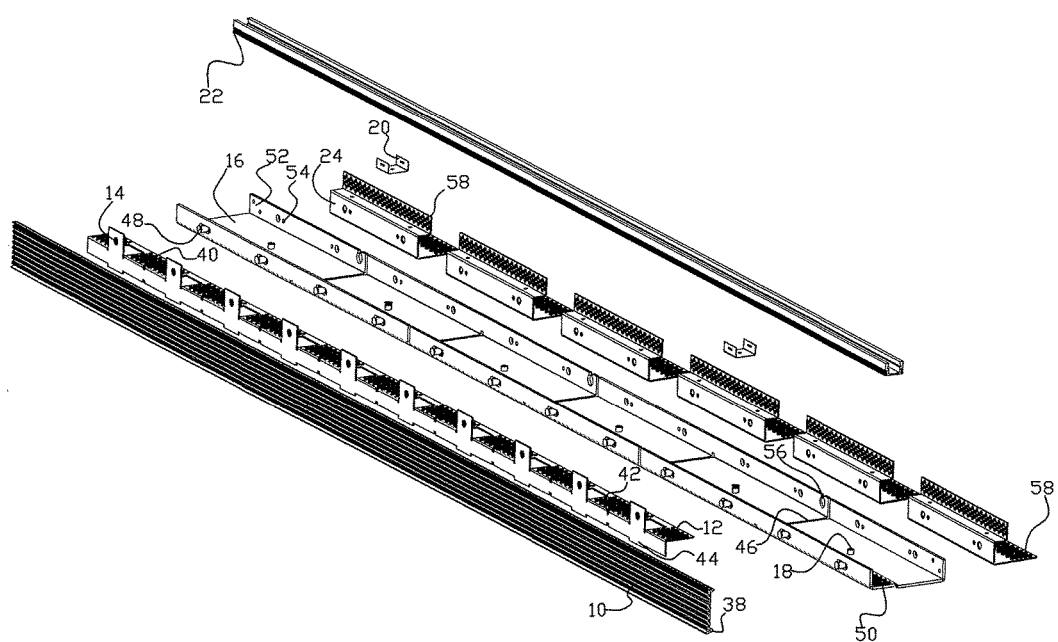
FIG. 4 is an isometric exploded view of an embodiment of the invention.
Figure 5:
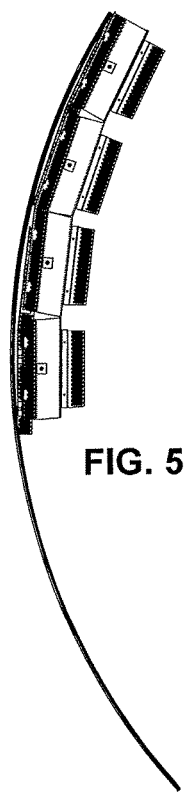
FIG. 5 is a plan view of an embodiment of the invention in a curved position.
Figure 6:
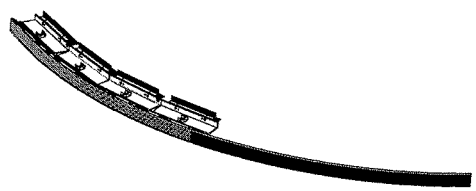
FIG. 6 is an isometric view of an embodiment of the invention in a curved position from the viewpoint of the fascia.
Figure 7:
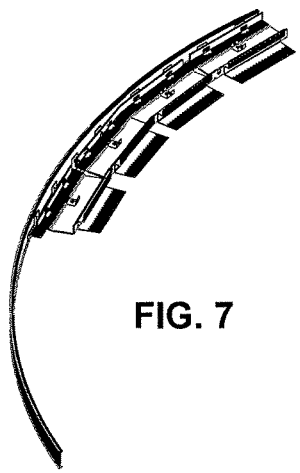
FIG. 7 is an isometric view of an embodiment of the invention in a curved position from the viewpoint of the mounting cleat.

The exemplary light fixture assembly includes the flexible connection bracket 12, highlighted in FIG. 4, that connects the polymer fascia 10 through the captive guides 38 and connection tabs 44 to the main carriage body 16. This connection bracket 12 translates smooth curved geometry defined by fascia 10 to the angular geometry of main carriage body 16 through captive pins 14. The flexibility of the flexible connection bracket 12 is achieved through the usage of defined pre-stress points 42 in the main carriage body 16. The connection bracket 12 has a pattern of screw guides or perforations 40. These perforations 40 allow for a drywall screw (or similar) to attach drywall to the main carriage body 16 through a corresponding pattern of perforations 50 while simultaneously locking the flexible apparatus to its intended shape. This connection bracket 12 can be constructed of a variety of materials including, but not limited to, metals, plastics and rubbers.

The exemplary light fixture assembly includes the captive pins 14 that connect the fascia 10 and flexible connection bracket 12 to the main carriage body 16. Each pin 14 relates to a corresponding slot 48 on the main carriage body 16 that allows free range of motion over a defined path. This path allows for a range of movement in two axes that, in turn, allows the captive pins 14 to adjust to the orientation of the connection bracket 12 and the main carriage body 16.

The exemplary light fixture assembly includes the main carriage body 16. The main carriage body 16 has a continuous metallic channel that is subdivided into articulating segments of similar composition. The main carriage body 16 is able to articulate into the angular geometry of the traditional building materials of the architecture. This articulation is provided through linear or angular transverse slots 46. The transverse slots 46 define the segments of the continuous channel and create a condition that defines pre-stress points that can be referred to as a metallic living hinge, or a polymeric living hinge. This hinge is the fulcrum of the angular articulation. The composition of these segments includes, but is not limited to: slots 48 providing for captive pin movement, slots 46 providing for articulation, a mounting receptacle 18 providing for adjustable mounting of light fixtures or equipment, slots 48 providing for attachment to the flexible connection bracket 12, perforations 50 providing for conventional material attachment through use in conjunction with screws 28 (or similar fasteners) on the flexible connection bracket 12 to adhere the building materials to the main carriage body 16, mechanical connection points 54 providing for mounting the cleat 24 or mounting accessory connection, a joining point 52 providing for end-to-end assembly, and electrical ingress 56 providing for electrical wire ingress.

The provision for adjustable mounting of light fixtures or equipment is the fixed or adjustable mounting receptacle 18. This mounting receptacle 18 is intended to receive mechanical mounting hardware, such as a light fixture clip 20, for light fixtures 22, electrical devices, sensors, power units, transmitters, signage, cables or similar equipment. The provisions for attachment to the flexible connection bracket 12 include the linear patterned perforations 50 that correspond to perforations 40 on the connection bracket 12. These linear perforations 50 promote the alignment of the channel to non-congruent angular planes defined by flexible connection bracket 12 and fascia 10 when a conventional drywall screw 28 or similar is driven through the main carriage body 16 for the purposes of attaching ceiling portion 30 (e.g., sheet rock) as prescribed by installation of drywall building materials. The provisions for integration to the mounting cleat 24 include provisions for mechanical connection points 54 (fasteners or weldments) to join mounting cleat 24 to the main carriage body 16. The provisions for end-to-end assembly include joining points 52 (e.g., alignment pins), joiner brackets, clips and plates constructed of metals, polymers and similar materials. The electrical ingress 56 may comprise a code-compliant power feed knock-out.

The exemplary light fixture assembly includes the mounting receptacle 18 for light fixtures 22 through the use of clips 20 or similar mounting devices, electrical devices, sensors, power units, transmitters, signage, cables or similar equipment. The mounting receptacle 18 can be fixed, articulating, floating, angled or similar to allow for tangential alignment of elongated lighting fixtures 22 or similar equipment. The mounting receptacle 18 can receive mounting hardware for clips 20 to hold lighting fixtures 22 or similar equipment. The mounting receptacle 18 will define and maintain the position of light fixtures 22 in the optimal alignment for indirect lighting of a cove.

The exemplary light fixture assembly includes the mounting cleat 24 which has multiple embodiments that will allow the attachment of the main carriage body 16 to the building structure 26. The mounting cleats 24 define a wireway 60 between the main carriage body 16 and the building structure 26 to allow for discreet electrical pathways to provide power to lighting fixtures 22 or similar electrical equipment. The mounting cleat 24 has a perforated pattern 58 of screw guides. The perforated pattern 58 allows for a drywall screw (or similar) 28 to attach mounting cleat 24 to building structure 26. Through this mounting cleat 24, the building structure 26 influences the articulation of the main carriage body 16 to generate a path on any axis.

Flex points allow the carriage to be influenced by, or take the shape or curvature of, the surrounding architectural context to which it is installed or mounted, without compromising the structural integrity of space defined by the carriage for the purpose of mounting electronic gear such as lighting fixtures or other related elements. The complex shapes can be described as, but are not limited to, such curved figures resembling an "S," "U," "0," and or "C" forms. The flex point mechanical system is comprised of pre-stressed segments or living hinges that exist in the composition of the carriage at predetermined intervals. These segments are adjoined to a floating bracket via pins and movement guide slots that translate the angular geometry of the linear platform to a continuously flexible fascia that visually defines a smooth curve. In the final installation of the invention it will appear to be fully integrated within the surrounding architectural finishes.

One or more embodiments of the present invention have been described. Nevertheless, it will be understood that various modifications may be made without departing from the spirit and scope of the invention. For example, many elements may be combined or further separated. Additionally, a variety of structural shapes and cooperating features of the various components are possible. Various other manufacturing techniques and materials may be used. Multiple lighting elements and multiple other electrical components are also possible. Architectural and design considerations may influence any particular implementation giving rise to the possibility of mounting on a non-vertical surface and mounting in various extending arrays. Accordingly, other embodiments are within the scope of the following claims.

What is claimed:

1. A field-curvable carriage for a flexible light cove adapted to be mounted to a surface of a building and comprising:
   a flexible fascia;
   a flexible main carriage body with provisions for integration of light fixtures or electrical components;
   a flexible connection bracket connecting the fascia to the main carriage body;
   captive pins that travel along a defined path and connect the flexible connection bracket to the main carriage body; and
   mounting cleats adapted to connect the main carriage body to the building surface.

2. The field-curvable carriage of claim 1 wherein the flexible fascia is continuous and creates a smooth, even profile along curves or straight installations.

3. The field-curvable carriage of claim 1 wherein the flexible connection bracket is located within captive guides on the fascia.

4. The field-curvable carriage of claim 1 wherein the flexible connection bracket has predefined stress points allowing for single or double axis flexibility.

5. The field-curvable carriage of claim 1 wherein the captive pins allow for movement along any axis in a predefined path of slots within the main carriage body.

6. The field-curvable carriage of claim 1 wherein the captive pins slide within predefined slots within the main carriage body to create a path for curvature.

7. The field-curvable carriage of claim 6 wherein the fascia has a smooth geometry and the flexible connection bracket translates the smooth geometry of the fascia to the shape of the main carriage body.

8. The field-curvable carriage of claim 6 wherein the captive pins have a limited float to prevent hyper-flexing of materials that may cause fatigue.

9. The field-curvable carriage of claim 1 wherein the main carriage body integrates with the flexible connection bracket through captive pin slots.

10. The field-curvable carriage of claim 1 wherein the main carriage body has a pattern of screw guides adapted to lock traditional building materials to the main carriage body.

11. The field-curvable carriage of claim 1 wherein the main carriage body has an integrated receptacle adapted to integrate light fixtures or similar electrical devices.

12. The field-curvable carriage of claim 1 wherein the main carriage body has transverse slots that create a segmented channel.

13. The field-curvable carriage of claim 12 wherein the transverse slots define pre-stress points that form a living hinge providing flexibility to the main carriage body.

14. The field-curvable carriage of claim 1 wherein the main carriage body has an electrical ingress.

15. The field-curvable carriage of claim 1 wherein the shape of the mounting cleats creates a wireway that allows electrical wire or similar conduit to be run discreetly outside of the main carriage body.

16. A field-curvable carriage for a flexible light cove adapted to be mounted to a surface of a building and comprising:
- a continuous, flexible fascia creating a smooth, even profile along curves or straight installations and having captive guides;
- a flexible main carriage body with provisions for integration of light fixtures or electrical components, having a pattern of screw guides adapted to lock traditional building materials to the main carriage body, having an integrated receptacle adapted to integrate light fixtures or similar electrical devices, having transverse slots that create a segmented channel, and having an electrical ingress;
- a flexible connection bracket connecting the fascia to the main carriage body, being located within the captive guides on the fascia, and having predefined stress points allowing for single or double axis flexibility;
- captive pins that travel along a defined path and connect the flexible connection bracket to the main carriage body, allow for movement along any axis in a predefined path of slots within the main carriage body, slide within predefined slots within the main carriage body to create a path for curvature, and have a limited float to prevent hyper-flexing of materials that may cause fatigue; and
- mounting cleats adapted to connect the main carriage body to the building surface, the shape of the mounting cleats creating a wireway that allows electrical wire or similar conduit to be run discreetly outside of the main carriage body.

17. The field-curvable carriage of claim 16 wherein the flexible connection bracket translates the smooth geometry of the fascia to the shape of the main carriage body.

18. The field-curvable carriage of claim 16 wherein the main carriage body integrates with the flexible connection bracket through captive pin slots.

19. The field-curvable carriage of claim 16 wherein the transverse slots define pre-stress points that form a living hinge providing flexibility to the main carriage body.

20. A field-curvable carriage for a flexible light cove adapted to be mounted to a surface of a building and comprising:
- a continuous, flexible fascia creating a smooth, even profile along curves or straight installations and having captive guides;
- a flexible main carriage body with provisions for integration of light fixtures or electrical components, having a pattern of screw guides adapted to lock traditional building materials to the main carriage body, having an integrated receptacle adapted to integrate light fixtures or similar electrical devices, having transverse slots that create a segmented channel and define pre-stress points that form a living hinge providing flexibility to the main carriage body, having an electrical ingress, and having captive pin slots;
- a flexible connection bracket connecting the fascia to the main carriage body, being located within the captive guides on the fascia, having predefined stress points allowing for single or double axis flexibility, translating the smooth profile of the fascia to the shape of the main carriage body, and integrating with the main carriage body through the captive pin slots;
- captive pins that travel along a defined path and connect the flexible connection bracket to the main carriage body, allow for movement along any axis in a predefined path of slots within the main carriage body, slide within predefined slots within the main carriage body to create a path for curvature, and have a limited float to prevent hyper-flexing of materials that may cause fatigue; and
- mounting cleats adapted to connect the main carriage body to the building surface, the shape of the mounting cleats creating a wireway that allows electrical wire or similar conduit to be run discreetly outside of the main carriage body.

* * * * *